United States Patent [19]

Sieck et al.

[11] Patent Number: 5,464,518
[45] Date of Patent: Nov. 7, 1995

[54] CYLINDRICAL MAGNETRON SHIELD STRUCTURE

[75] Inventors: Peter A. Sieck, Santa Rosa; John R. Porter, Napa, both of Calif.

[73] Assignee: The BOC Group, Inc., New Providence, N.J.

[21] Appl. No.: 308,828

[22] Filed: Sep. 19, 1994

Related U.S. Application Data

[63] Continuation of Ser. No. 4,964, Jan. 15, 1993, abandoned.

[51] Int. Cl.[6] .................................................... C23C 14/34
[52] U.S. Cl. .............................. 204/192.12; 204/192.32; 204/192.33; 204/192.13; 204/298.03; 204/298.11; 204/298.21; 204/298.22; 204/298.28
[58] Field of Search .................. 204/192.12, 192.32, 204/192.33, 298.03, 298.11, 298.21, 298.22, 298.31, 298.32, 298.37

[56] References Cited

U.S. PATENT DOCUMENTS

| | | | |
|---|---|---|---|
| 4,356,073 | 10/1982 | McKelvey | 204/192 R |
| 4,407,708 | 10/1983 | Landau | 204/298.19 X |
| 4,410,407 | 10/1983 | Macaulay | 204/192 EC |
| 4,417,968 | 11/1983 | McKelvey | 204/192 R |
| 4,422,916 | 12/1983 | McKelvey | 204/192 R |
| 4,443,318 | 4/1984 | McKelvey | 204/298 |
| 4,466,877 | 8/1984 | McKelvey | 204/298 |
| 4,525,264 | 6/1985 | Hoffman | 204/298.21 X |
| 5,108,574 | 4/1992 | Kirs et al. | 204/298.21 X |
| 5,213,672 | 5/1993 | Hartig et al. | 204/298.22 |

FOREIGN PATENT DOCUMENTS

| | | | |
|---|---|---|---|
| 0012732 | 1/1980 | Japan | 204/298.21 |
| 3229969 | 4/1983 | Japan | 204/298.22 |
| 0215975 | 8/1989 | Japan | 204/298.21 |
| WO92/02659 | 2/1992 | WIPO | 204/298.21 |

OTHER PUBLICATIONS

Chapman, Brian; *Glow Discharge Processes;* John Wiley & Sons, Inc.; 1980; pp. 196–198.

Wright, Michael and Terry Beardow; "Design advances and applications of the rotatable cylindrical magnetron"; *J. Vac. Sol. Technol.*, May/Jun. 1986; pp. 388–392.

*Primary Examiner*—Nam Nguyen
*Attorney, Agent, or Firm*—David A. Draegert; Larry R. Cassett

[57] ABSTRACT

A rotating cylindrical sputtering target surface as part of a magnetron has cylindrical shields adjacent each end of the target that are shaped at their respective inner edges to maximize etching and to prevent condensation and subsequent arcing that undesirably occurs when certain materials, particularly dielectrics, are being sputtered. If two or more rotating targets are employed in a single magnetron system, each is similarly shielded. In an alternative form, the target is provided with a single cylindrical shield that is cut away for a significant portion of the distance around the cylinder to provide an opening through which a sputtering region of the target is accessible, while maintaining shielding of the target end regions. This alternative single shield is similarly shaped at portions of its inner edges adjacent to the opening to maximize etching and to prevent undesired condensation and subsequent arcing. The preferred shield structure is rotatable in order to allow the position of the sputtering activity to be selected.

30 Claims, 3 Drawing Sheets

CYLINDRICAL MAGNETRON SHIELD STRUCTURE

This is a continuation of application Ser. No. 08/004,964, filed Jan. 15, 1993, abandoned.

BACKGROUND OF THE INVENTION

This invention relates generally to magnetrons of a type using rotating cylindrical sputtering targets, and, more specifically, to structures and techniques for minimizing arcing in such magnetrons.

Cylindrical magnetrons are becoming widely used for depositing films on substrates. An example is the deposition of a stack of dielectric and metal layers on a surface of a glass substrate for the purpose of filtering out a portion of solar energy from passing through the glass. Such a substrate is positioned within a vacuum chamber containing at least one, and usually two, rotating cylindrical targets containing sputtering material on an outer surface thereof. Both inert and reactive gases are generally introduced into the chamber. A voltage applied to the sputtering target, with respect to either the vacuum chamber enclosure or a separate anode, creates a plasma that is localized along a sputtering zone of the target by stationary magnets positioned within the target. Material is sputtered off the target surface and onto the substrate by bombarding the target with electrons and ions of the plasma as it passes through the stationary sputtering zone.

The magnets are usually of a permanent magnet type, arranged along a line within the rotating cylindrical target and held against rotation with the target. The sputtering zone is created by the magnets along substantially the entire length of the cylindrical sputtering target and extends only a small circumferential (radial) distance around it. Traditionally, the magnets are arranged so that the sputtering zone exists at the bottom of the cylindrical target, facing a substrate being coated directly beneath.

Although deposition of the film is desired to take place only on the substrate, it is also deposited on other surfaces within the reactive chamber. This can create a problem in many situations, especially when certain dielectrics are being deposited as the film. For example, if the target surface is silicon or aluminum and the reactive gas is oxygen, silicon dioxide is deposited on the target surface, surfaces of target supporting structures, and the like, as well as on the substrate that is intended to be coated. After a certain build-up of dielectric material on internal vacuum chamber surfaces has occurred over time, arcing to those surfaces can begin. Arcing is undesirable since it generates particles that contaminate the film being deposited on the substrate, and overloads the power supply that creates the plasma through an electrical connection with the sputtering target surface and the vacuum chamber walls or some other anode.

An advantage of a rotating cylindrical sputtering target is that such a film deposited on the target is subjected to being sputtered away as the target surface passes through the sputtering zone, thus counteracting the undesirable film build-up. Despite this self-cleaning characteristic, however, undesirable arcing still occurs in rotary magnetrons under certain circumstances.

Recently, a cylindrical magnetron shield structure has been developed to minimize this undesirable arcing that occurs in rotary cylindrical magnetrons. See Kirs, Milan R., et al., "Cylindrical Magnetron Shield Structure,"U.S. Pat. No. 5,108,574. As shown in Kirs et al., the deposition of dielectric film can be minimized by dark space shielding, which prevents plasma formation in the dark space and thereby reduces film deposition and subsequent arcing.

Although the shield structure of Kirs et al. greatly enhances the self-cleaning characteristic of rotary cylindrical magnetrons, some deposition of condensate has been found to occur at the far ends of the target cylinder. Unlike the deposition of dielectric films that concerned Kirs et al., this deposition of condensate from the vapor present in the system occurs regardless of the existence of plasma. Thus, the problem of condensate deposition is not fully resolved by the use of dark space shielding.

Because even slight deposition of dielectric or insulating materials can lead to undesirable arcing, it is a principal object of the present invention to provide a mechanism and technique for further minimizing such deposition and related arcing.

SUMMARY OF THE INVENTION

This and additional objects are accomplished by the present invention, wherein, briefly and generally, a shaped cylindrical shield structure is provided around and spaced apart from at least a portion of the sputtering target outside of said sputtering zone. By careful examination of the shape of the magnetic field zone and the distribution of the condensate at the ends of the tube, the shape of the cylindrical shield structure is designed to conform to the contours of the magnetic field zone, thereby maximizing sputter etching of the tube ends while minimizing deposition of condensate. In a preferred form, the shield structure consists of separate cylindrical end shields positioned at opposite ends of the target structure and shaped at their respective inner edges adjacent to the magnetic field zone to conform to the outer contours of the "race-track" pattern of the magnetic field zone. The shield structure may also consist of a unified shield wherein these shaped cylindrical end shields are connected at the portions their respective inner edges lying outside the magnetic field zone by a cylindrically shaped structure, leaving a window opening in the shield structure adjacent to the magnetic field zone so that the target surface is bombarded by electrons and ions of the plasma as it is rotated through the sputtering zone. The cylindrical shield structure does not rotate with the cylindrical target. In systems that provide for the sputtering zone to be circumferentially positionable around the target by rotation of its magnets, the cylindrical shield structure is also made rotatable so that its window may follow the sputtering zone to its new position.

Such a shield structure has been found to be beneficial in three primary respects. First, it has been found that the self-cleaning attribute of a rotating sputtering target generally does not extend to the far ends of the target cylinder since the sputtering zone controlled by the magnets within the cylinder does not extend completely to its ends. An abrupt termination of the permanent magnets within the target cylinder creates some discontinuities in the sputtering zone at the ends of the cylinder, and thus in the character of the plasma itself. Since the self-cleaning attribute of a rotating target does not fully extend to the ends of the target cylinder, the shield structure of the present invention extends completely around the sputtering cylinder at its ends and, further, may be extended to cover portions of rotating target support structures adjacent to its ends which are particularly susceptible to undesirable film build-up because of their proximity to the sputtering surface and plasma.

Additionally, it has been found that much like planar magnetrons, rotary cylindrical magnetrons etch the sputtering surface in a "race-track" pattern, while causing a buildup of arc-causing condensate film at the ends of the target cylinder in a pattern that conforms to the shape of the "race-track." Since this undesirable condensate film conforms to the "race-track" shape of the magnetic field zone, the shield structure of the present invention is similarly shaped to conform to the contours of the magnetic field zone, thereby shielding those areas at the ends of the target cylinder that would otherwise be exposed to condensate film build-up and subsequent arcing.

A third beneficial aspect of the shield structure comes from covering a central portion of the length of the sputtering target cylinder, despite the self-cleaning attribute of a rotating magnetron mentioned above. It has been found that there are circumstances where an undesired dielectric or other film deposited on portions of the target outside of the sputtering zone are not completely removed when those surface portions again pass through the sputtering zone. Further, there are circumstances where it has been found desirable to be able to cover a portion of the cylindrical target surface during co-sputtering; that is, in a situation where two rotating cylindrical target structures are adjacent one another and material from at least one of them is being sputtered onto the surface of another before being resputtered onto a substrate. Such co-sputtering techniques are described in U.S. patent application Ser. No. 07/549,392, filed Jul. 6, 1990, now abandoned, which is incorporated herein by this reference. It is the ability to cover a portion of the target during such co-sputtering that is provided by the present invention.

Additional objects, features and advantages of the present invention will become apparent from the following description of a preferred embodiment thereof, which description should be taken in conjunction with the accompanying drawings.

DESCRIPTION OF A PREFERRED EMBODIMENT

Figure 1:
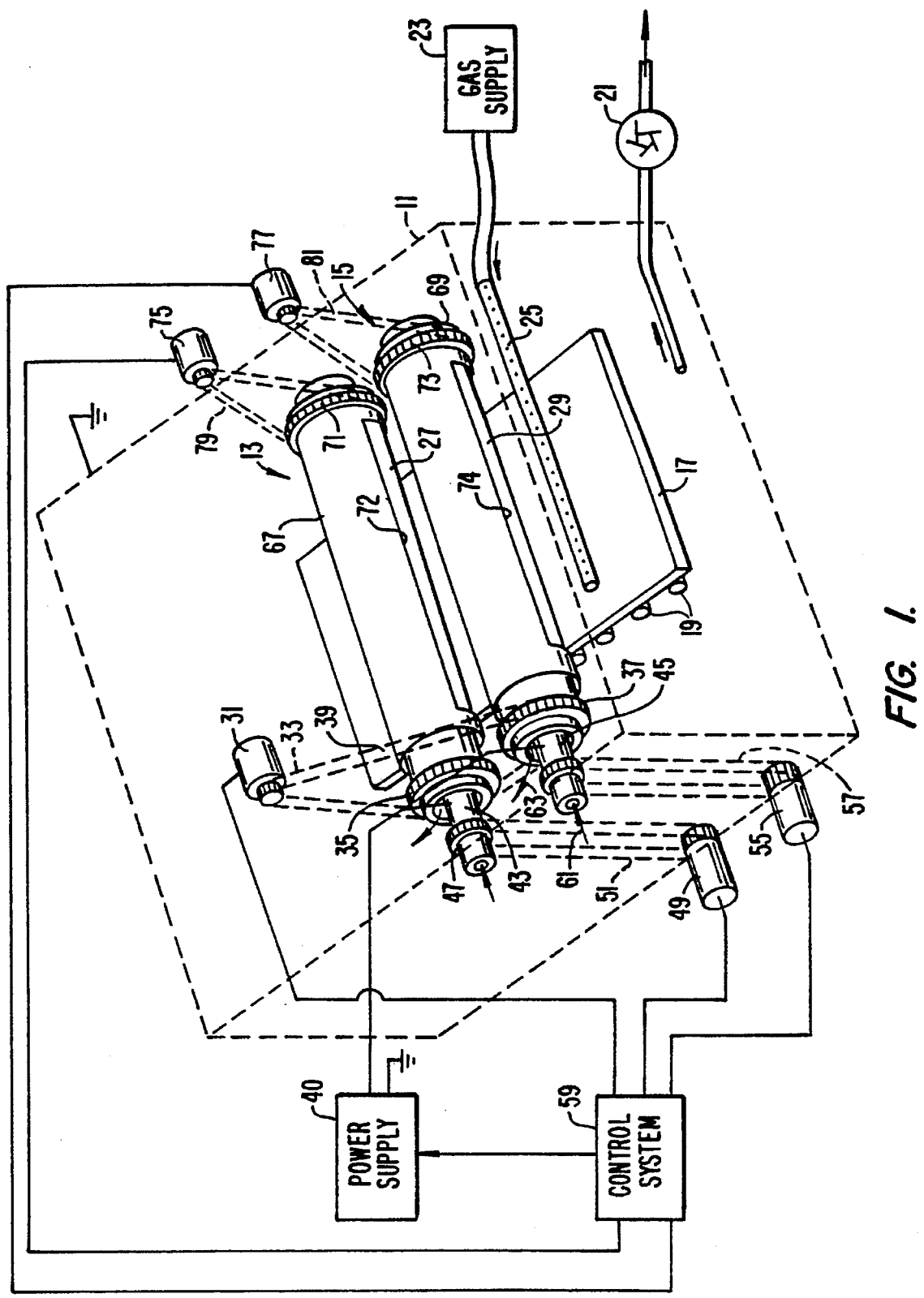
FIG. 1 schematically illustrates a dual cylindrical sputtering target magnetron that utilizes the improvement of the present invention.

Referring initially to FIG. 1, an entire magnetron system utilizing the present invention is generally described before the details of the invention's preferred implementation are explained. A box 11, shown in dotted outline, indicates metallic walls of a vacuum chamber in which the sputtering occurs. Within that chamber are two rotatable cylindrical target structures 13 and 15 which are held by the frame 11 in a manner to be rotatable about their longitudinal axes. The target structures 13 and 15 are generally held with their axes parallel to one another, but that is not a requirement. Further, although two target structures are illustrated in FIG. 1, many applications need only employ one such target, and other applications can benefit by having more than two. However, the use of two target structures 13 and 15 is common.

The magnetron of FIG. 1 is shown to have a substrate 17 held by a support structure 19. The support structure 19 may be rollers to allow the substrate 17 to be passed through the vacuum chamber in a continuous process. A vacuum is drawn within the vacuum chamber by an appropriate pumping system 21. One or more gases are provided by a supply 23 to the vacuum chamber by some convenient delivery system, such as a perforated tube 25 positioned across the vacuum chamber. The particular gases utilized depend primarily upon the film desired to be deposited on the substrate 17.

Cylindrical pieces 27 and 29 of sputtering material provided as part of the target structures 13 and 15, respectively, are generally made of the same material but can be of different materials, depending upon the nature of the film to be deposited on the substrate 17. An electric motor source 31, positioned outside the vacuum chamber, rotates the target assemblies by rotating, through a toothed belt 33, pulleys 35 and 37 which are attached to respective spindles 39 and 41. The sputtering materials 27 and 29 are attached to the respective spindles 39 and 41 in order to rotate with them.

A plasma is created within the vacuum chamber by applying a negative voltage from a power supply 40 to the sputtering surfaces with respect to the vacuum chamber metal frame 11 or some other anode, which is usually connected to ground potential. The plasma is positioned adjacent a sputtering zone of the cylindrical sputtering targets 27 and 29, controlled by the positioning of their respective magnets (not shown in FIG. 1). These magnets are positioned along the length of their respective cylindrical sputtering targets 27 and 29, while extending a small circumferential, or radial, distance therearound. These magnets are most conveniently held within the sputtering targets 27 and 29 by attachment to respective coolant conduits 43 and 45. These cooling conduits are provided as part of their respective target assemblies in a manner to be rotatable independently of rotation of their respective cylindrical sputtering targets 27 and 29.

Thus, the position of the magnets in each target assembly, and thus the position of the sputtering zone of each, is controlled by rotation of these cooling conduits. Specifically, a pulley 47 is attached to the conduit 43 and driven from an electrical motor source 49 outside the vacuum chamber by a toothed belt 51. Similarly, a pulley 53 is attached to the coolant conduit 45 and is controlled as to rotatable position by an electrical motor source 55 positioned outside the vacuum chamber and connected with it by a toothed belt 57. The motor sources 49 and 55 are preferably stepper motors which thereby hold their respective conduits 43 and 45 in selected positions and keep them from rotating with their respective sputtering targets 27 and 29.

A cooling liquid supply and exhaust system (not shown) outside the vacuum chamber provides coolant into the center of each of the conduits 43 and 45, as indicated by an arrow 61, and exhausts the heated coolant from a space between the outside of the conduits and an interior surface of the spindles, as indicated by an arrow 63. An electrical and electronic control system 59 operates to control the power supply 40 and various parameters of the magnetron system being shown, including motors 31, 49 and 55.

The improvement of the present invention is implemented in the system of FIG. 1 by providing cylindrically-shaped shield structures 67 and 69, or blocking means, around and spaced from each of the cylindrical target surfaces 27 and 29, respectively. Additionally, the cylinders extend in length beyond the end of the sputtering material in order to cover exposed surfaces of adjacent spindles and their supporting structures. Window openings 72 and 74, adjacent to respective shield structures 67 and 69, are large enough to expose the sputtering zone. These areas do not extend the full length of the cylindrical shield structures 67 and 69, however, leaving covered completely around their circumferences the respective sputtering surfaces 27 and 29 for a distance immediately adjacent the opposite ends of the sputtering material cylinder.

If the sputtering zone defining magnets inside the target assemblies are held fixed, the shield structures 67 and 69 are then most easily held with their windows in a fixed position. However, if the magnets are made to be rotatable, as described in the embodiment of FIG. 1, such as is useful in the co-sputtering application previously mentioned, it is desirable to be able to controllably rotate the shield structures 67 and 69 so that their respective openings 72 and 74 follow the moving sputtering zone. The extent of shield structure rotation is made to be at least as great as the extent of magnet rotation. This allows the radial extent of the openings 72 and 74 to be kept small and thus maximize the coverage of the sputtering surface outside the sputtering zone. On the other hand, it is possible to make the radial extent of the openings 72 and 74 very large, thus allowing a limited rotation of the magnets without having to rotate the shield structures. But maximum flexibility of operation is permitted, of course, when rotation of the shield structures 67 and 69 is provided over three-hundred-sixty degrees about the respective longitudinal axes of the cylindrically-shaped sputtering surfaces 27 and 29.

In order to accomplish such rotation, the shield structure 67 is provided with a pulley 71 around its circumference near one end, and the shield structure 69 is similarly provided with a pulley 73. An electrical motor source 75 rotates the shield structure 67 through a toothed belt 79, and a motor source 77 rotates the shield 69 through a toothed belt 81. The motor sources 75 and 77 are preferably stepper motors and are also controlled by connection with the control system 59.

Figure 2:
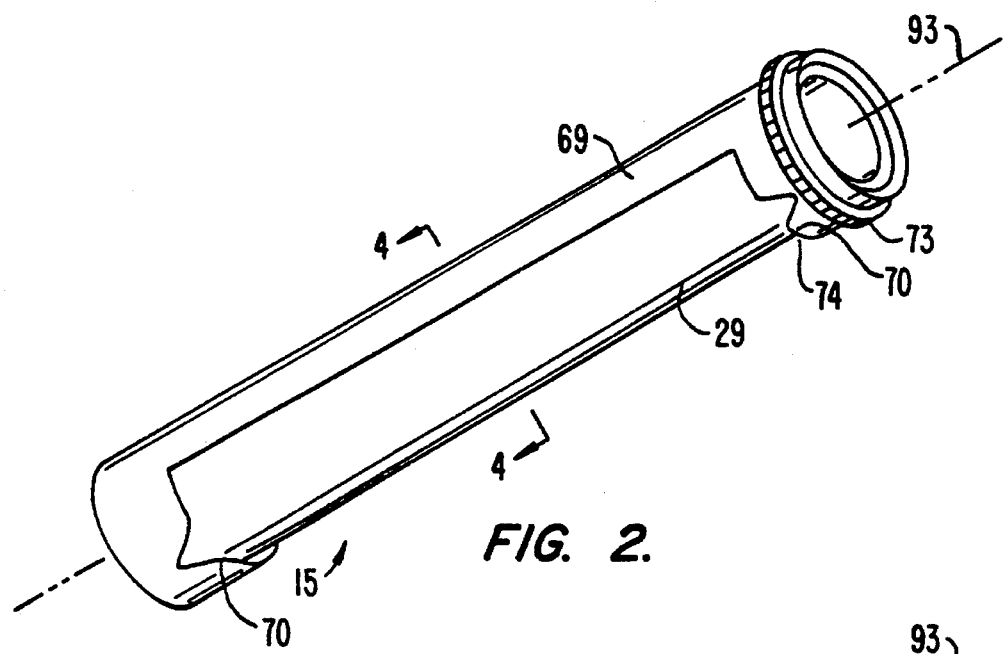
FIG. 2 shows in isometric view a portion of one of the target assemblies of FIG. 1, including the improvement of the present invention.
Figure 4:
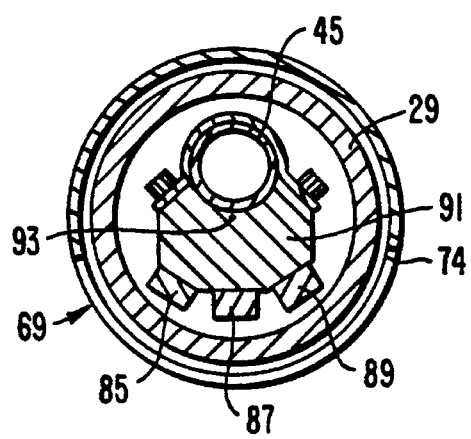
FIG. 4 is a cross-section of a target assembly taken at Section 4—4 of FIG. 2.

Additional details of the target assemblies shown in FIG. 1 are apparent from the views of FIGS. 2 and 4 of the target assembly 15. Elongated magnets 85, 87 and 89, of alternate polarity, are carried within the sputtering material cylinder 29 by a support structure 91 that is attached to the coolant tube 45. In this magnetic assembly, the sputtering tube 29 and the shield structure 69 are independently rotatable about a longitudinal axis 93 by respective motor sources 55, 31 and 77.

It will be noted from FIG. 4 that a space exists between an outside surface of the target cylinder 29 and an inside surface of the cylindrically-shaped shield tube 69. Both these surfaces are, in cross-section, concentric circles that are separated by a distance that is significantly less than one inch, preferably less than substantially one-quarter inch. A small separation is required in order to avoid plasma from forming in the space between these two elements.

According to the present invention, shield structure 69 of FIG. 2 is shaped at portions of its inner edges 70 that are adjacent to window openings 72 and 74 to conform to the contours of the magnetic field zone. The shape of the shield structure 69 is shown in FIG. 2, while the method of designing the shape of the shield structure is fully described below in relation to FIG. 6. The contoured shape of the shield structure 69 at inner edges 70 maximizes the self-cleaning characteristic of rotary cylindrical magnetrons according to a "race-track" pattern of etching, while minimizing the formation of condensate at the end portions of a cylindrical sputtering target assembly. A most important aspect of the invention is the shaping of the shield structure to minimize undesirable condensation of materials vaporized during the sputtering process, particularly dielectrics, and thereby reduce the often catastrophic arcing that results.

Figure 3:
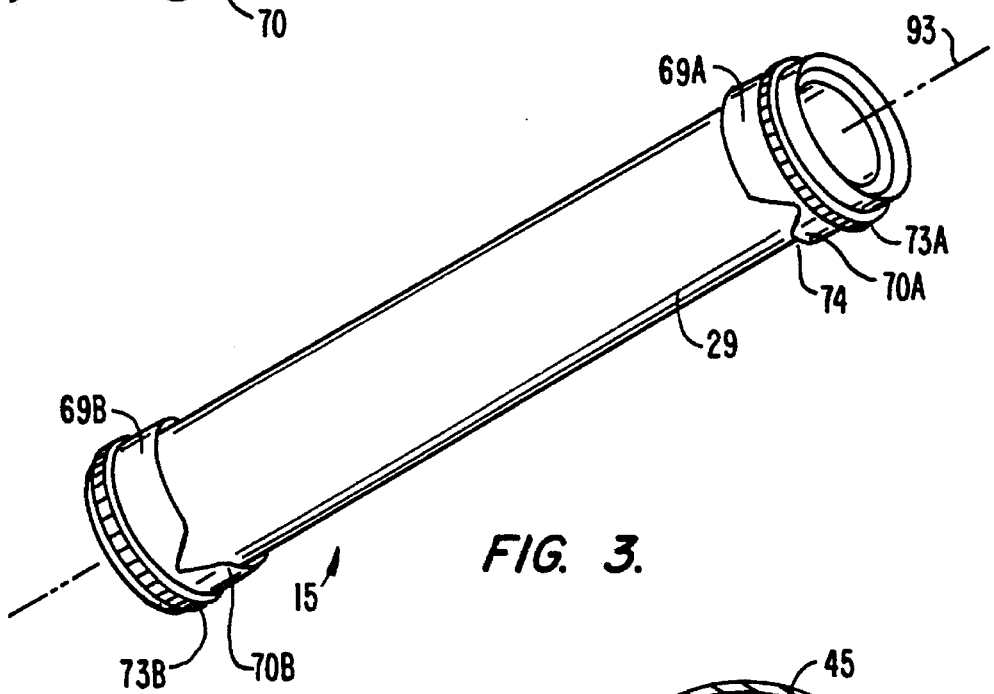
FIG. 3 shows in isometric view a portion of one of the target assemblies of FIG. 1, including the improvement of the present invention.

An alternative embodiment of the present invention is shown in FIG. 3. Similar to the embodiment illustrated in FIG. 2 comprised of shield structure 69, this alternative embodiment includes separate shield structures 69A and 69B positioned around and spaced from the target surface 29. Shield structures 69A and 69B are positioned at opposite ends of the target assembly 15 and are provided with pulleys 73A and 73B around their respective circumferences to be independently rotatable. According to the present invention, shield structures 69A and 69B are shaped at portions of their respective inner edges 70A and 70B that are adjacent to the opening 29 to conform to the contours of the magnetic field zone. It will be understood that the magnetron system, the magnetic assembly, the independent rotation, the supporting structure, and the shaping features of the invention described herein are adapted to be equally applicable in the embodiment shown in FIG. 3.

Figure 5:
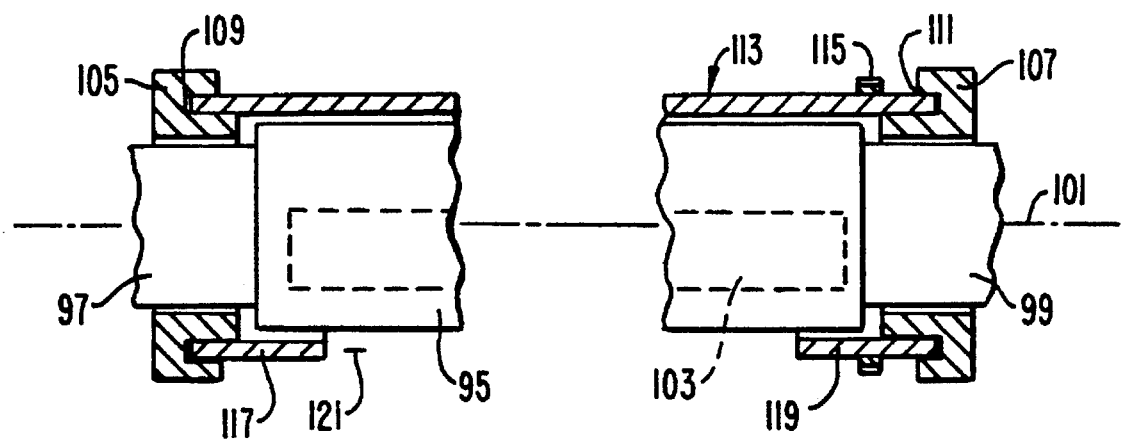
FIG. 5 is a partial section view of a preferred support assembly for a rotating target assembly of the types illustrated in FIGS. 1–5.

Referring to FIG. 5, a specific supporting structure for a target assembly is given. A cylindrical sputtering surface 95 is carried through end spindles 97 and 99 in a manner to be rotatable about a longitudinal axis 101. A magnetic structure 103 is positioned within the target cylinder 95. As part of target supporting structures, plates 105 and 107 are provided at opposite ends of the target assembly. These end plates carry respective annular grooves 109 and 111 into which a cylindrically-shaped shield structure 113 is inserted at its ends. The shield structure 113 is then easily rotatable by a motor source connected to a pulley 115.

This support arrangement for the shield structure 113 also has an advantage of covering portions of the end plates 105 and 107 that are immediately adjacent ends of the sputtering target cylinder 95. These supporting structure surfaces are particularly susceptible to deposition of undesirable films on them, because of their proximity to the plasma sputtering zone, so are very useful for this purpose. Additionally, as previously mentioned, end portions 117 and 119 are circumferentially continuous around the shield structure and extend far enough along its length to cover respective end portions of the sputtering target 95 where the self-cleaning action of a rotating target acts as effectively as it does in more central portions of the target's length. A window 121 is provided, however, in the shield 113 to expose at least the sputtering zone. The shield structure 113 is preferably made of a material that itself has a low sputtering yield, such as stainless steel.

Prior to this invention, the design of cylindrical magnetron shield structures was based on the observation of the target structures after they had undergone sputter etching in a rotary cylindrical magnetron in which the target structures were rotated. Because the target structures were rotated, the sputtering surface was observed as a uniformly etched surface with a band of deposited material at the ends of the target structure. Based on this observation, rotary cylindrical magnetrons were thought to avoid the problem of "race-track" etching of the sputtering surface, as observed in planar magnetrons with a fixed sputtering zone. See Kirs, Milan R., et al., "Cylindrical Magnetron Shield Structure," U.S. Pat. No 5,108,574. Consequently, shield structures for such rotary cylindrical magnetrons were designed with rectangularly-shaped inner edges adjacent to the sputtering zone to shield the area at the ends of the target structure corresponding to the observed condensation band.

Figure 6:
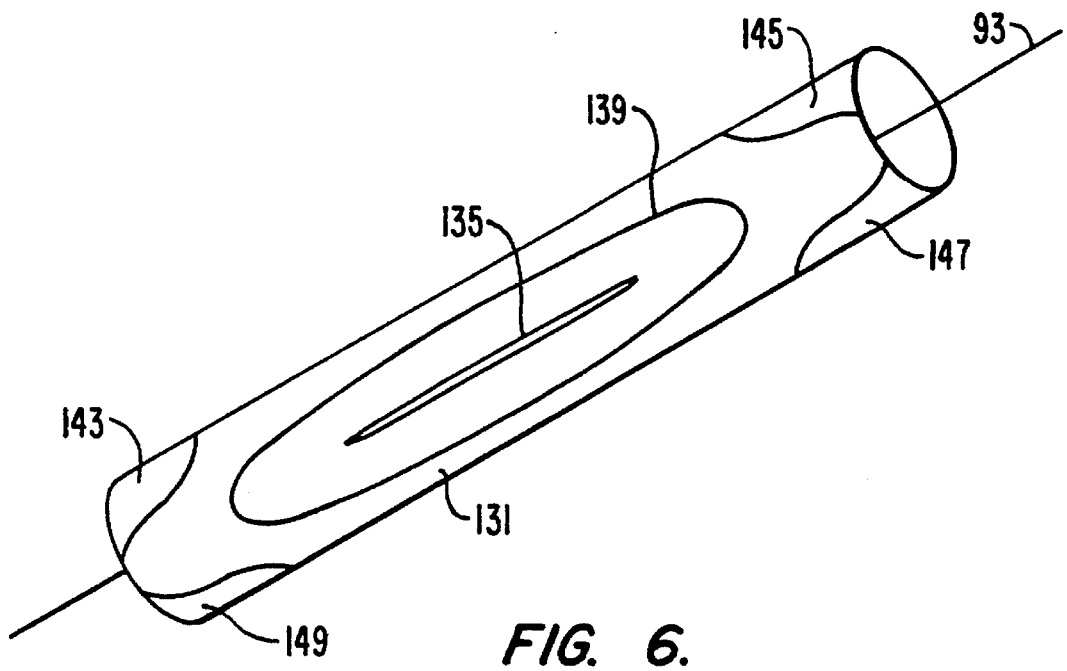
FIG. 6 shows in isometric view a "racetrack" pattern of etching and a conforming pattern of condensation at the end portions of a cylindrical sputtering target assembly of FIG. 1 that are used in designing the improvement of the present invention.

It has been discovered, however, that the sputtering surfaces of rotary cylindrical magnetrons are indeed etched in a well-defined "race-track" pattern, causing condensate build-up in a conforming pattern at the ends of the target structure. Referring to FIG. 6, a cylindrical sputtering target 131 is shown after it has undergone sputter etching in a rotary cylindrical magnetron in which the target structures are held immobile. A "race-track" pattern on the sputtering surface bounded by boundary 139 indicates the area of the target surface lying between the region of maximum magnetic field strength 135 and boundary 139 that has been etched during the sputter etching process. Areas 143, 145, 147, and 149 on the sputtering surface, which conform to the "race-track" etch pattern, indicate the pattern of condensation at the end portions of the sputtering target. Such condensation occurs at positions on the sputtering surface where the rate of condensation exceeds the rate at which deposited condensate is removed by sputtering.

When a sputtering target exposed to condensation is further examined, there is evidence of significant damage to the target structure attributable to catastrophic arcing. Additionally, an examination of the coated substrate reveals similar evidence of damage to the coating attributable to arcing. By contrast, when a sputtering target is shielded from condensation using the shaped shield structures of the present invention, arcing is minimized and damage to the target structure and the substrate coating is significantly reduced.

In a preferred method of designing the cylindrically-shaped shield structure of the present invention, magnetic paper is positioned on the target surface during operation of the rotating cylindrical magnetron. Magnetic paper is commercially available from a number of sources, including Edmund Scientific Company of New Jersey. During operation, the magnetic paper is marked by isomagnetic lines indicating the configuration of the magnetic field zone. The shield structure is then shaped at its inner edges adjacent to the magnetic field zone to conform to the contours of the magnetic field zone, as indicated by the isomagnetic lines. In a preferred form, the resulting design takes the form of a curved, notched shape at the inner edges of the shield structure, as illustrated in FIGS. 2 and 3.

Alternatively, the cylindrically-shaped shield structure is designed according to the patterns of condensation and etching that are observable on the target structure after the rotary cylindrical magnetron has been operated with the target structure held stationary. Referring to FIGS. 2, 3 and 6, the inner edges 70 in FIG. 2 and 70A and 70B in FIG. 3 of the shield structure are designed in a curved, notched shape that follows the contours of the areas of condensation 143, 145, 147 and 149 in FIG. 6 appearing on the target surface. Similarly, the inner edges may be designed in a curved, notched shape that follows the contours of the "race-track" etch pattern 139 in FIG. 6 as it appears at the ends of the target structure.

Once shaped, the inner edges of the shield structure are positioned at an optimum distance from the magnetic field zone so that condensation and subsequent arcing are minimized at the ends of the target without disturbing the plasma. In a preferred method of designing the shield structure, the shield structure of the present invention is positioned on the target ends, a fixed distance from the magnetic field zone. During operation, arcing activity is monitored using a strip chart recorder that is connected to power supply 40 of FIG. 1. The recorder is used to record any reduction in voltage that occurs over time in response to arcing activity, with fewer voltage drops indicating less arcing activity in the magnetron system. This sequence is repeated with the shaped inner edges of the shield structure positioned at various distances from the magnetic field zone, until the optimum distance from the magnetic field zone is determined. In a preferred form, the shield structure is extended lengthwise toward the magnetic field zone such that the inner edges of the shield and the magnetic field zone are separated by this optimum distance.

The shield structure of the present invention provides for maximum self-cleaning in the sputtering zone and minimum condensation beyond the sputtering zone and thereby reduces arcing activity in a rotary cylindrical magnetron. Although the present invention has been described with respect to a preferred embodiment thereof, it will be understood that the invention is entitled to protection within the full scope of the appended claims.

It is claimed:

1. A sputtering apparatus for depositing film on a substrate in a vacuum chamber, comprising:

a magnetron including therein at least one target structure with an outer cylindrically-shaped surface of sputtering material;

first and second support structures holding said target structure at opposite ends thereof such that said target structure is rotatable about its longitudinal axis;

a magnet assembly within said target structure that provides a magnetic field zone extending along a length of said sputtering material surface and extending a circumferential distance therearound;

first and second cylindrical shields, said shields carried at opposite ends of said target structure by said first and second support structures and extended axially along said sputtering material surface to substantially cover the ends of said sputtering material surface, said first shield having an inner edge closest to said second shield and said second shield having an inner edge closest to said first shield;

said inner edges being non-rectangularly shaped to conform substantially to a shape of a pattern of condensation of vaporized material on said target structure which forms when said target structure is held stationary; and said inner edges being positioned to shield regions where condensation of vaporized material on said target structure would otherwise occur at a rate which exceeds a rate at which deposited condensate is removed from said target structure by sputtering.

2. A sputtering apparatus for depositing film on a substrate in a vacuum chamber, comprising:

a magnetron including therein at least one target structure with an outer cylindrically-shaped surface of sputtering material;

first and second support structures holding said target structure at opposite ends thereof such that said target structure is rotatable about its longitudinal axis;

a magnet assembly within said target structure that provides a magnetic field zone extending along a length of said sputtering material surface and extending a circumferential distance therearound;

first and second cylindrical shields, said shields carried at opposite ends of said target structure by said first and second support structures and extended axially along said sputtering material surface to substantially cover the ends of said sputtering material surface, said first shield having an inner edge closest to said second shield and said second shield having an inner edge closest to said first shield;

said inner edges being non-rectangularly shaped to conform substantially to a shape of a pattern of etching of sputtering material on said target structure which occurs when said target structure is held stationary; and said inner edges being positioned to shield regions where condensation of vaporized material on said target structure would otherwise occur at a rate which exceeds a rate at which deposited condensate is removed from said target structure by sputtering.

3. The apparatus according to any one of claims 1 and 2, wherein each of said first and second cylindrical shields is additionally shaped with continuous portions around its circumference at each of said opposite ends that are positioned to cover said sputtering surface for a distance adjacent each of its said opposite ends and extend over adjacent portions of said first and second support structures.

4. The apparatus according to any one of claims 1 and 2, wherein said inner edges of said shields are positioned a distance from said magnetic field zone sufficient to stabilize arcing adjacent to said magnetic field zone.

5. The apparatus according to any one of claims 1 and 2, wherein said shields are connected at corresponding portions of their inner edges which are not adjacent to said magnetic field zone by a cylindrically-shaped structure extending around a portion of the circumference of said sputtering material surface that is substantially outside said magnetic field zone to form a unified shield, said unified shield having an opening at least as large as said magnetic field zone and extending around a portion of the circumference of said sputtering material surface that is substantially inside said magnetic field zone and having a length less than a distance between opposite ends of the sputtering surface of said target structure.

6. A sputtering apparatus for depositing film on a substrate in a vacuum chamber, comprising:

at least one elongated target having a sputtering surface with an outside cylindrical shape of a given diameter and a given length between first and second ends thereof;

first and second support structures respectively supporting said first and second sputtering surface ends in a manner that allows said target to rotate about a central longitudinal axis thereof;

means positioned within said target for providing a magnetic field zone extending along a length of said sputtering surface and a circumferential distance therearound;

electrically controlled driving means coupled to said target structure for rotating said sputtering surface through said magnetic field zone;

first and second cylindrical shields separated by a distance of less than substantially one-quarter inch from said sputtering surface for minimizing condensation of vaporized material at said first and second sputtering surface ends, said shields carried at opposite ends of said target by said first and second support structures and extended axially along said sputtering surface to substantially cover the ends of said sputtering surface, said shields having continuous portions extending around the circumference of said first and second ends positioned to cover said sputtering surface for a distance adjacent each of its said first and second ends and extend over adjacent portions of said first and second support structures, said first shield having an inner edge closest to said second shield and said second shield having an inner edge closest to said first shield;

said inner edges being non-rectangularly shaped to conform substantially to a shape of a pattern of condensation of vaporized material on said target structure which forms when said target structure is held stationary; and said inner edges being positioned to shield regions where condensation of vaporized material on said target structure would otherwise occur at a rate which exceeds a rate at which deposited condensate is removed from said target structure by sputtering.

7. A sputtering apparatus for depositing film on a substrate in a vacuum chamber, comprising:

at least one elongated target having a sputtering surface with an outside cylindrical shape of a given diameter and a given length between first and second ends thereof;

first and second support structures respectively supporting said first and second sputtering surface ends in a manner that allows said target to rotate about a central longitudinal axis thereof;

means positioned within said target for providing a magnetic field zone extending along a length of said sputtering surface and a circumferential distance therearound;

electrically controlled driving means coupled to said target structure for rotating said sputtering surface through said magnetic field zone;

first and second cylindrical shields separated by a distance of less than substantially one-quarter inch from said sputtering surface for minimizing condensation of vaporized material at said first and second sputtering surface ends, said shields carried at opposite ends of said target by said first and second support structures and extended axially along said sputtering surface to substantially cover the ends of said sputtering surface, said shields having continuous portions extending around the circumference of said first and second ends positioned to cover said sputtering surface for a distance adjacent each of its said first and second ends and to extend over adjacent portions of said first and second support structures, said first shield having an inner edge closest to said second shield and said second shield having an inner edge closest to said first shield;

said inner edges being non-rectangularly shaped to conform substantially to a shape of a pattern of etching of sputtering material on said target structure which occurs when said target structure is held stationary; and said inner edges being positioned to shield regions where condensation of vaporized material on said target structure would otherwise occur at a rate which exceeds a rate at with deposited condensate is removed from said target structure by sputtering.

8. The apparatus according to any one of claims 6 and 7, wherein said inner edges of said shields are positioned a distance from said magnetic field zone sufficient to stabilize arcing adjacent to said magnetic field zone.

9. The apparatus according to any one of claims 6 and 7, wherein said shields are connected at corresponding portions of said inner edges which are not adjacent to the magnetic field zone by a cylindrically-shaped structure extending around a portion of the circumference of said sputtering surface that is substantially outside said magnetic field zone to form a unified shield, said unified shield having an opening at least as large as said magnetic field zone and extending around the portion of the circumference of said sputtering surface that is substantially inside said magnetic field zone and having a length less than a distance between said first and second ends of said sputtering surface.

10. The apparatus according to any one of claims 1, 6, 9, 2 and 7, in which said inner edges adjacent to said magnetic field zone have a curved shape.

11. The apparatus according to any one of claims 1, 6, 2 and 7, in which said inner edges adjacent to said magnetic field zone have a notched shape.

12. A method of forming cylindrical end shields for use in a sputtering apparatus for depositing film on a substrate in a vacuum chamber comprised of a rotating cylindrical magnetron including therein at least one rotatable target structure, having an outer cylindrically-shaped surface of sputtering material and held at opposite ends thereof by first and second support structures, a magnet assembly within said target structure that provides a magnetic field zone, and first and second cylindrical end shields carried at opposite ends of said target structure by said support structures, said first shield having an inner edge closest to said second shield and said second shield having an inner edge closest to said first shield, comprising the steps of:
  (a) operating said rotating cylindrical magnetron such that said magnetic field zone is provided and said target structure is immobile;
  (b) determining positions on said immobilized target structure where condensation of material vaporized during said operation has occurred; and
  (c) shaping said shields at said inner edges, non-rectangularly, to conform substantially to a pattern of said positions determined in step (b).

13. The method of claim 12, additionally comprising the step of optimizing the distance between said shields and said magnetic field zone by placing said shields on said opposite ends of a cylindrical sputtering structure, operating said rotating cylindrical magnetron, recording arcing activity using recording means, and adjusting said distance to minimize said arcing activity.

14. The method of claim 12, additionally comprising the step of optimizing the distance between said shields and said magnetic field zone by placing said shields on said opposite ends of a cylindrical sputtering structure, operating said rotating cylindrical magnetron, recording voltage within the vacuum chamber of the sputtering apparatus using recording means, and adjusting said distance to minimize variations in voltage adjacent to said magnetic field zone.

15. The method of claim 12, additionally comprising the step of connecting said end shields at portions of said inner edges which are not adjacent to said magnetic field zone by a cylindrically-shaped structure extending around the portion of the circumference of a cylindrical sputtering structure that is substantially outside said magnetic field zone to form a unified shield, said unified shield having an opening at least as large as said magnetic field zone and extending around the portion of the circumference of said cylindrical sputtering structure that is substantially inside said magnetic field zone and having a length less than a distance between opposite ends of said cylindrical sputtering structure.

16. The method of claim 12, additionally comprising the steps of:
  (a) optimizing the distance between said shields and said magnetic field zone by placing said shaped shields on said opposite ends of a cylindrical sputtering structure, operating said rotating cylindrical magnetron such that said magnetic field zone is provided, recording arcing activity using recording means, and adjusting said distance to minimize said arcing activity; and
  (b) connecting said end shields at portions of said inner edges which are not adjacent to said magnetic field zone by a cylindrically-shaped structure extending around the portion of the circumference of said cylindrical sputtering structure that is substantially outside said magnetic field zone to form a unified shield, said unified shield having an opening at least as large as said magnetic field zone and extending around the portion of the circumference of said cylindrical sputtering structure that is substantially inside said magnetic field zone and having a length less than a distance between opposite ends of said cylindrical sputtering structure.

17. The method of claim 12, additionally comprising the steps of:
  (a) optimizing the distance between said shields and said magnetic field zone by placing said shaped shields on said opposite ends of a cylindrical sputtering structure, operating said rotating cylindrical magnetron such that said magnetic field zone is provided, recording voltage within the vacuum chamber of the sputtering apparatus using recording means, and adjusting said distance to minimize variations in voltage adjacent to said magnetic field zone; and
  (b) connecting said end shields at portions of said inner edges which are not adjacent to said magnetic field zone by a cylindrically-shaped structure extending around the portion of the circumference of said cylindrical sputtering structure that is substantially outside said magnetic field zone to form a unified shield, said unified shield having an opening at least as large as said magnetic field zone and extending around the portion of the circumference of said cylindrical sputtering structure that is substantially inside said magnetic field zone and having a length less than a distance between opposite ends of said cylindrical sputtering structure.

18. The method according to claim 12, in which the shaping step includes shaping said shields at said inner edges such that said inner edges have a curved shape.

19. The method according to claim 12, in which the shaping step includes shaping said shields at said inner edges such that said inner edges have a notched shape.

20. A method of sputter etching a cylindrical sputtering structure using a sputtering apparatus for depositing film on a substrate in a vacuum chamber comprised of a rotating cylindrical magnetron including therein at least one rotatable target structure, having an outer cylindrically-shaped surface of sputtering material and held at opposite ends thereof by first and second support structures, and a magnet assembly within said target structure that provides a magnetic field zone, comprising the steps of:
  (a) operating said rotating cylindrical magnetron such that said magnetic field is provided and said target structure is held stationary;

(b) determining a shape of a pattern of condensation of vaporized material on said target structure which forms when said rotating cylindrical magnetron is operated according to step (a); and (c) blocking regions at opposite ends of said target structure where condensation of vaporized material on said target structure would otherwise occur at a rate which exceeds a rate at which deposited condensate is removed from said target structure by sputtering using blocking means, said blocking means being non-rectangularly shaped to conform substantially to the shape of the pattern of condensation determined according to step (b) and positioned to shield said regions.

21. The method of claim 20, wherein said blocking means extends around the portion of the circumference of said cylindrical sputtering structure that is substantially outside said magnetic field zone.

22. A sputtering apparatus for depositing film on a substrate in a vacuum chamber, comprising:

a magnetron including therein at least one target structure with an outer cylindrically-shaped surface of sputtering material;

first and second support structures holding said target structure at opposite ends thereof such that said target structure is rotatable about its longitudinal axis;

a magnet assembly within said target structure that provides a magnetic field zone extending along a length of said sputtering material surface and extending a circumferential distance therearound;

first and second cylindrical shields, said shields carried at opposite ends of said target structure by said first and second support structures and extended axially along said sputtering material surface to substantially cover the ends of said sputtering material surface, said first shield having an inner edge closest to said second shield and said second shield having an inner edge closest to said first shield; and said inner edges being non-rectangularly shaped to conform substantially to a pattern of deposition of vaporized material on said target structure adjacent to the ends thereof which is determinable when said magnetron is operated without rotating said target structure.

23. The apparatus according to claim 22, wherein the pattern is curved.

24. The apparatus according to claim 22, wherein the inner edges of the shields are positioned along a longitudinal axis of said target structure to cover regions where vaporized material would otherwise be deposited at a rate that exceeds a rate at which such deposited material is removed by sputtering.

25. In a magnetron including a vacuum chamber and therein, at least one elongated cylindrical sputtering surface rotatable about an axis thereof and a magnetic structure carried non-rotatably therewithin and extending along a length thereof, a method of depositing a material on a substrate positioned within the chamber by sputtering from the sputtering surface, comprising:

(a) defining a pattern of deposition of vaporized material on the sputtering surface adjacent to ends thereof which is determinable when the magnetron is operated without rotating the sputtering surface;

(b) shielding regions of the sputtering surface where vaporized material would otherwise be deposited, with shields having non-rectangular inner edges substantially conforming to the defined pattern; and (c) operating the magnetron with the sputtering surface rotating and the shields held non-rotatably.

26. The method according to claim 25, wherein the defined pattern is curved.

27. The method according to claim 25, wherein step (b) includes positioning the edges of the shields along a longitudinal axis of the sputtering surface to cover regions where vaporized material would otherwise be deposited at a rate that exceeds a rate at which deposited material is removed by sputtering.

28. A method of forming cylindrical end shields for use in a sputtering apparatus for depositing film on a substrate in a vacuum chamber comprised of a rotating cylindrical magnetron including therein at least one rotatable target structure, having an outer cylindrically-shaped surface of sputtering material and held at opposite ends thereof by first and second support structures, a magnet assembly within said target structure that provides a magnetic field zone, and first and second cylindrical end shields carried at opposite ends of said target structure by said support structures, said first shield having an inner edge closest to said second shield and said second shield having an inner edge closest to said first shield, comprising the steps of:

(a) defining a pattern of deposition of vaporized material on the target structure adjacent to the ends thereof which would occur if the magnetron were operated without rotating the target structure;

(b) shaping the inner edges of the shields, non-rectangularly, to conform substantially to the defined pattern.

29. The method of claim 28, wherein the defined pattern is curved.

30. The method of claim 28, further comprising the step of optimizing the distance between the inner edges of the shields along a longitudinal axis of the sputtering surface, thereby shielding regions where vaporized material would otherwise be deposited at a rate that exceeds a rate at which deposited material is removed by sputtering.

* * * * *